(12) United States Patent
Kram et al.

(10) Patent No.: US 7,517,472 B2
(45) Date of Patent: Apr. 14, 2009

(54) BLEND OF VISCOSITY MODIFIER AND LUMINESCENT COMPOUND

(75) Inventors: Shari L. Kram, Midland, MI (US); William B. Marshall, Midland, MI (US); James J. O'Brien, Midland, MI (US); Todd A. Pickering, Midland, MI (US); Weishi Wu, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 11/419,364

(22) Filed: May 19, 2006

(65) Prior Publication Data

US 2006/0197059 A1 Sep. 7, 2006

Related U.S. Application Data

(63) Continuation of application No. 10/847,525, filed on May 17, 2004, now abandoned.

(60) Provisional application No. 60/472,288, filed on May 21, 2003.

(51) Int. Cl.
*C09K 11/06* (2006.01)
(52) U.S. Cl. .................................. 252/301.16; 428/917
(58) Field of Classification Search ............ 252/301.16; 428/690, 917
See application file for complete search history.

(56) References Cited

U.S. PATENT DOCUMENTS

| | | | |
|---|---|---|---|
| 3,935,009 A | | 1/1976 | Crommentuyn et al. |
| 5,376,456 A | * | 12/1994 | Cumming et al. ........... 428/457 |
| 5,708,130 A | | 1/1998 | Woo et al. |
| 5,777,070 A | | 7/1998 | Inbasekaran et al. |
| 5,929,194 A | | 7/1999 | Woo et al. |
| 6,078,196 A | | 6/2000 | Gayles |
| 6,169,163 B1 | | 1/2001 | Woo et al. |
| 6,309,763 B1 | | 10/2001 | Woo et al. |
| 6,329,086 B1 | | 12/2001 | Shi et al. |
| 6,353,083 B1 | | 3/2002 | Inbasekaran et al. |
| 6,363,083 B1 | | 3/2002 | Spielbauer |
| 6,372,154 B1 | * | 4/2002 | Li ........................ 252/301.16 |
| 6,433,115 B2 | | 8/2002 | Hawker et al. |
| 6,566,153 B1 | | 5/2003 | Yang |
| 6,566,808 B1 | * | 5/2003 | Duggal et al. ............... 313/512 |
| 6,569,706 B2 | | 5/2003 | Pakbaz et al. |
| 6,575,800 B1 | | 6/2003 | Kobayashi et al. |
| 6,576,975 B2 | | 6/2003 | Yang |
| 6,762,234 B2 | | 7/2004 | Grizzi |
| 6,825,061 B2 | | 11/2004 | Hokari et al. |
| 2001/0001050 A1 | | 5/2001 | Miyashita et al. |
| 2002/0013013 A1 | | 1/2002 | Victor et al. |
| 2002/0155215 A1 | | 10/2002 | Miyashita et al. |
| 2002/0167024 A1 | | 11/2002 | Jabbour et al. |
| 2003/0064174 A1 | | 4/2003 | Miteva et al. |
| 2004/0170861 A1 | * | 9/2004 | Culligan et al. ............. 428/690 |
| 2004/0195551 A1 | | 10/2004 | Endo et al. |

FOREIGN PATENT DOCUMENTS

| | | | |
|---|---|---|---|
| EP | 1 018 857 | | 7/2000 |
| EP | 1 083 775 | | 3/2001 |
| EP | 1083775 | * | 3/2001 |
| EP | 1 103 590 | | 5/2001 |
| EP | 0 786 926 | | 8/2001 |
| JP | 2004204114 A | | 7/2004 |
| WO | WO 95/01871 | | 1/1995 |
| WO | WO 98/32783 | | 7/1998 |
| WO | WO 99/21233 | | 4/1999 |
| WO | WO 02/18513 | | 3/2002 |

OTHER PUBLICATIONS

Zhou et al., "Synthesis and Relationships between the Structures and Properties of Monodisperse Star-Shaped Oligofluorenes", Organic Letters, vol. 5, No. 19, 2003, pp. 3543-3546.
Kreger, et al., Novel starshaped molecules based on fluorene, Synthetic Metals, 2001, pp. 163-164, vol. 119.
Shirota, et al., Development of Hole-Blocking Amorphous Molecular Materials and Their Application in Organic Light-Emitting Diodes, Proceedings of SPIE-The International Society for Optical Engineering, 2002, pp. 203-210, vol. 4464.
Okumoto, et al., New Class of Hole-Blocking Amorphous Molecular Materials and Their Application in Blue-Violet-Emitting Fluorescent and Green-Emitting Phosphorescent Organic Electroluminescent Devices, Chemistry of Materials, 2003, pp. 699-707, vol. 15.

* cited by examiner

*Primary Examiner*—C. Melissa Koslow
(74) *Attorney, Agent, or Firm*—Sughrue Mion, PLLC

(57) ABSTRACT

The present invention relates to a composition comprising a blend of a luminescent polymer and a low molecular weight (<5000 amu) viscosity modifier, which has an emission maximum in the range of 350-480 nm, contains no exocyclic double bonds, and modifies the viscosity of the polymer without substantially altering emissive properties of the neat polymer. Modification of viscosity without concomitant modification of emissive properties is desirable where the polymer is already tuned to emit at the desired wavelength.

6 Claims, No Drawings

BLEND OF VISCOSITY MODIFIER AND LUMINESCENT COMPOUND

CROSS-REFERENCE STATEMENT

This is a continuation of application Ser. No. 10/847,525 filed May 17, 2004, now abandoned, which claims benefit of Provisional Application No. 60/472,288 filed May 21, 2003. The entire disclosures of the prior applications are hereby incorporated by reference.

This invention was made with Government support under contract, N00421-98-C-1187 awarded by the U.S. Naval Warfare Center, Aircraft Division, with funding supplied by the Defense Advanced Research Projects Agency. The Government has certain rights in this invention.

BACKGROUND OF THE INVENTION

The present invention relates to a blend of a viscosity modifier and a luminescent compound.

Luminescent polymers find use in a number of applications including roll-to-roll, screen, and ink jet printing; spin, dip, and spray coating; and "doctor blading." While all of these applications may require materials that emit at particular wavelengths, they often widely differ in their viscosity requirements. Thus, an emitting luminescent polymer that is useful in both roll-to-roll and ink jet applications may require a high viscosity (100 cps) for the former application and a relatively low viscosity for the latter (about 10 cps).

Viscosity modification of luminescent polymers is known. For example, in U.S. Pat. No. 6,372,154, Li describes the use of low molecular weight functional additives to adjust the viscosity of luminescent inks (L-inks) that contain viscous luminescent polymers. These functional additives are described as possessing electron-transporting properties or hole-transporting properties that can be used to modify the charge transporting abilities of the L-ink in addition to viscosity modification. However, it may be desirable to modify the viscosity of luminescent polymers without changing charge transporting properties, which may adversely affect light-emitting properties. Thus, if the luminescent polymer inherently emits at a desired wavelength, it would be disadvantageous to use a modifier that reduces viscosity but concomitantly shifts the luminescent emission maximum of the blend to a wavelength substantially different from the optimal wavelength. Accordingly, it would be advantageous in the art of viscosity modification of luminescent polymers to discover modifiers that allow tuning of viscosity without substantially altering emissive properties of the neat polymer.

SUMMARY OF THE INVENTION

The present invention addresses the deficiencies in the art by providing a composition comprising a blend of a) a luminescent polymer having a weight average molecular weight ($M_w$) of at least 20,000 and b) a viscosity modifier that 1) is a solid at room temperature; 2) has a $M_w$ of less than 5000; 3) has a luminescent emission maximum in the range of 350 to 480 nm; and 4) does not substantially diminish charge transporting properties of the combination of the modifier and the polymer; and 5) contains no exocyclic conjugated double bonds; wherein the modifier and its concentration in the blend are selected so that the blend exhibits a luminescent emission maximum that is within 20 nm of the luminescent emission maximum of the polymer alone.

The blend of the claimed invention provides a way to tune viscosity without substantially altering the luminescent emission maximum of the neat polymer. This effect is particularly advantageous where the neat polymer already possesses optimal luminescent emissive properties.

DETAILED DESCRIPTION OF THE INVENTION

The present invention is a composition that is a blend of a luminescent polymer and a viscosity modifier. The luminescent polymer can be any polymer that is luminescent under UV radiation or under a suitable electric field bias. Preferably, the polymer is luminescent under an electric field bias, that is, it is electroluminescent. Examples of luminescent polymers include those that contain structural units of: 9,9-disubstituted fluorenes including 9,9-dialkylfluorenes, 9,9-diarylfluorenes, and 9,9-aralkylfluorenes; 9-substituted fluorenes such as spirofluorenes; phenylenes including 2,5-dialkoxyphenylene and 2,5-dialkylphenylene; phenylenevinylenes including 2-methoxyl-5-(2'-ethylhexyl)phenylenevinylene, 2,5-dioctyloxy-1,4-phenylenevinylene, 2-silyl-1,4-phenylenevinylene, 2,5-disilyl-1,4-phenylenevinylene and 2,5-dialkyl-1,4-phenylenevinylene; thiophenes; 3-alkylthiophenes; thiophenevinylenes; pyrroles; acetylenes; diacetylenes; aniline; N-vinylcarbazole, and combinations thereof. As used herein, the term, "structural unit" refers to the remnant of the compound after it undergoes polymerization. Thus, a structural unit of a trans-acetylene is represented by the following structure:

Preferred luminescent polymers contain structural units of a 9,9-disubstituted fluorene that is polymerized through the 2 and 7 carbon atoms, which structural unit is represented by the following structure:

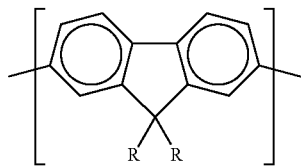

structural unit of 9,9-disubstituted fluorene where each R is independently alkyl, alkoxy, aryl, aryloxy, or aralkyl; preferably, $C_1$-$C_{20}$ alkyl, $C_1$-$C_{20}$-alkoxy, substituted or unsubstituted phenyl, biphenyl, naphthalenyl, anthryl, phenanthryl, thienyl, or furanyl; and more preferably $C_4$-$C_{12}$ alkyl, $C_4$-$C_{12}$-alkoxy, or substituted or unsubstituted phenyl or biphenyl.

The electroluminescent polymer more preferably contains structural units of a 9,9-disubstituted fluorene and structural units of at least one other comonomer. Examples of polymers containing structural units of a 9,9-disubstituted fluorene and other comonomers can be found in U.S. Pat. Nos. 5,708,130; 5,777,070; 6,169,163; and 6,363,083, which teachings are incorporated herein by reference.

Examples of suitable comonomers include polymerizable substituted and unsubstituted thiophenes, dithiophenes, benzodiathiazoles, oxazoles, oxadiazoles, benzoxazoles, dibenzofurans, benzothiophenes, dibenzothiophenes, dibenzosiloles, benzidines including N,N,N'N'-tetraarylbenzidines, diarylamines, triarylamines, benzenes, biphenylenes, naphthalenes, anthracenes, phenanthrenes, styrenes, quinolines, and stilbenes. More preferred comonomers include benzidines, dithiophenes, and benzothiadiazoles.

The viscosity modifier that is used to make the blend is solid at room temperature. It has a weight average molecular weight ($M_w$) of less than 5000, preferably less than 2000 and a polydispersity of preferably less than 1.2, more preferably less than 1.1, most preferably 1.0. The luminescent emission maximum of the modifier is not greater than 480 nm and not less than 350 nm, more preferably not less than 400 nm.

Consequently, the modifier has a wider band gap between the highest occupied molecular orbital (HOMO) and the lowest unoccupied molecular orbital (LUMO) than that of the emitting chromophore of the electroluminescent polymer. It is believed that this comparatively wide modifier band gap results in a substantial absence of shifting of luminescent emission maximum of the blend as compared to the polymer.

The modifier is selected so as not to substantially diminish charge transporting properties of the combination of the modifier and the polymer because such modifiers tend to adversely affect the efficiency of the luminescent material. Examples of modifiers with such an adverse tendency are those that contain heteroatoms with delocalized unshared pairs of electrons such as N, O, and S atoms with delocalized unshared pairs of electrons. Thus, di-naphthalene-1-yl-diphenyl-biphenyl-4,4'-diamine (α-NPA), which contains two nitrogen atoms with delocalized unshared pairs of electrons, would not be a suitable modifier for the luminescent polymer.

The modifier is also selected so as not to contain exocyclic, that is, it contains no non-aromatic, conjugated double bonds because such compounds tend to oxidize readily. Thus, 1,1,4,4-tetraphenyl-1,3-butadiene (TPB) would also not be a suitable modifier for the luminescent compound.

Furthermore, the selection of modifier and its concentration in the blend are such that the blend exhibits a luminescent emission maximum that is within 20 nm, preferably within 10 nm, more preferably within 5 nm, and most preferably within 1 nm of the luminescent emission maximum of the polymer alone. Preferably, the weight percent concentration of the modifier based on the weight of the modifier and the luminescent polymer is at least 1 weight percent, more preferably at least 5 weight percent, and most preferably at least 10 weight percent; and preferably less than 60 weight percent, more preferably less than 50 weight percent, and most preferably less than 30 weight percent.

Examples of preferred modifiers are substituted and unsubstituted fluorene and blends thereof; fluorene oligomers such as mono-, bis-, and tris-9,9-disubstituted fluorenes and blends thereof; fluorenylidenes and blends thereof, and trifluorenylbenzenes and blends thereof. An example of a tris-9,9-disubstituted fluorene is illustrated by the following structure:

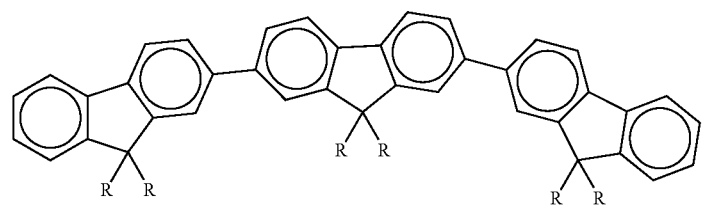

where R is previously defined.

The tris-9,9-disubstituted fluorene can be prepared, for example, by a Suzuki coupling reaction as shown:

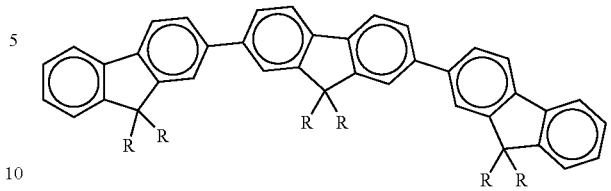

Similarly, trifluorenylbenzenes can prepared by reacting a tribromobenzene with the 2-(1,3,2-dioxaborloan-2-yl)-9,9-dibutylfluorene. Preferred trifluorenylbenzenes include 1,3,5-tri(9,9-disubstitutedfluorenyl)benzene, where R is previously defined.

An example of a bifluorenyl-substituted bifluorenylidene is illustrated by the following structure:

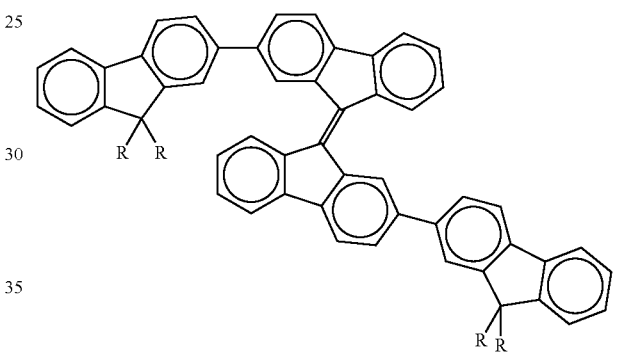

where R is previously defined. This bifluorenylidene can be prepared as illustrated by the following reaction sequence:

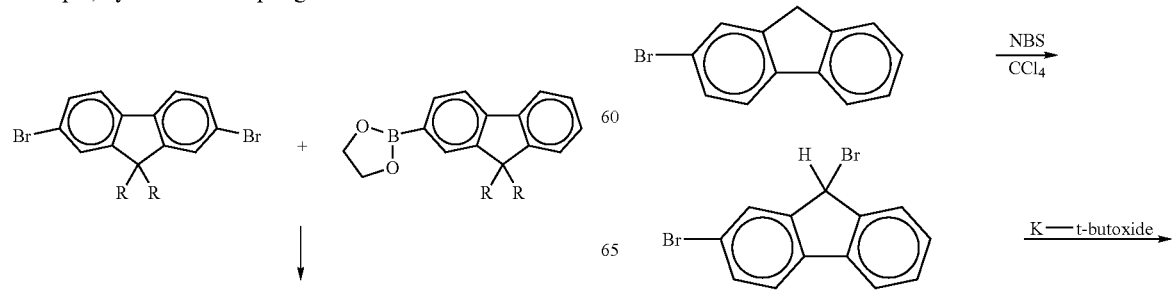

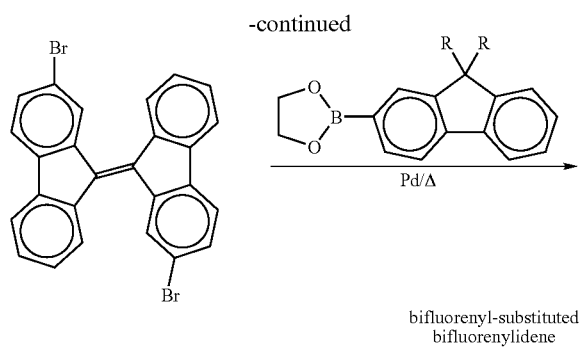

bifluorenyl-substituted
bifluorenylidene where R is as previously defined, preferably each R is independently $C_4$-$C_{12}$-alkyl, more preferably $C_4$-$C_8$-alkyl.

The luminescent polymer and the viscosity modifier are advantageously combined with a sufficient amount of solvent to make an ink. The amount of solvent varies depending upon the solvent itself and the application, but is generally used at a concentration of at least 80 weight percent, more preferably at least 90 weight percent, and most preferably at least 95 weight percent, based on the weight of the luminescent polymer, the modifier, and the solvent.

Examples of suitable solvents for the polymer and the modifier include benzene; mono-, di- and trialkylbenzenes including xylenes, mesitylene, toluene, n-propylbenzene, n-butylbenzene, n-pentylbenzene, n-hexylbenzene, cyclohexylbenzene, diethylbenzene, dodecylbenzene, and n-pentylbenzene; furans including tetrahydrofuran and 2,3-benzofuran; tetralin (tetrahydronaphthalene); cumene; cis-and trans-decalin (decahydronaphthalene); durene; chloroform; limonene; alkoxybenzenes including anisole, and methyl anisoles; alkyl benzoates including methyl benzoate; biphenyls including isopropyl biphenyl; pyrrolidinones including cyclohexylpyrrolidinone; imidazoles including dimethylimidazolinone; and combinations thereof. More preferred solvents include toluene, cyclohexylbenzene, xylenes, mesitylene, tetralin, methyl benzoate, isopropyl biphenyl, and anisole, and combinations thereof.

In a typical application, the ink formulation can be deposited on a substrate such as indium-tin-oxide (ITO) glass having a hole transporting material disposed thereon. The solvent is then evaporated, whereupon the ink forms a thin amorphous film of the viscosity modified luminescent polymer. Significantly, the presence of the viscosity modifier provides a way to tune viscosity without affecting the critical property of film thickness. The film is used as an active layer in an organic light-emitting diode (OLED), which can be used to make self-emissive flat panel displays.

The following examples are for illustrative purposes only and is not intended to limit the scope of the invention.

EXAMPLES 1-4

Preparation of Formulation of a Viscosity Modified Polymer

A. Preparation of
1,3,5-Tris(9,9-dibutylfluorenyl)benzene 1,3,5-Tribromobenzene (3.12 g, 9.92 mmol), 2-(1,3,2-dioxaborloan-2-yl)-9,9-dibutylfluorene (12.10 g 34.72 mmol), and Aliquat 336 (1.5 g) were dissolved in 125 mL of toluene and added to a 250-mL 3-necked flask equipped with an overhead stirrer and a reflux condenser connected to a nitrogen line. An aqueous $Na_2CO_3$ solution (2M, 30 mL) was added to the mixture and the flask was purged with nitrogen for 10 minutes. $Pd(PPh_3)_4$ (0.2 g, 0.5 mol %) was added to the mixture, which was then heated to 95° C. with stirring overnight. A solution of diethyldithiocarbamic acid sodium salt trihydrate (5%, 200 mL) was added and the mixture was heated at 80° C. for 16 hours. The aqueous layer was removed and the organic layer was washed with warm, dilute acteic acid solution (2%, 3×300 mL) followed by warm water (1×300 mL), and finally dried with $MgSO_4$. The toluene was removed in vacuo to yield the crude product, which was purified by column chromatography on silica gel with hexanes/methylene chloride as eluent to yield 7 g (78%) of 1,3,5-tris(9,9-dibutylfluorenyl)benzene as a white solid. HPLC showed that the product was >99% pure. The 1,2,4-tris(9,9-dibutylfluorenyl)benzene isomer was made essentially as described above except that 1,2,4-tribromobenzene was used as a starting material instead of the 1,3,5 isomer. Each of these isomers was used as a viscosity modifier as described in Part B.

B. Preparation of the Ink Formulation

The electroluminescent polymer, viscosity modifier and solvent are combined in a single vessel and mixed to obtain a homogeneous solution or ink. The following Table shows the concentration of the polymer and the modifier in the solvent. In each case, the solvent is a mixture of xylene isomers and ethylbenzene (obtained by J. T. Baker as VLSI grade mixed xylenes and analyzed as m-xylene, 40-65%; o-xylene, 15-20%; p-xylene <20%; ethyl benzene, 15-25%) at 98% wt/wt based on the total weight of the solvent, the polymer, and the modifier. Polymer 1304 refers to LUMATION* 1304 green light emitting polymer (a trademark of The Dow Chemical Company) and polymer 1100 refers to LUMATION* 1100 red light emitting polymer, both available from The Dow Chemical Company. VM1 refers to 1,2,4-tris(9,9-dibutylfluorenylbenzene) and VM2 refers to 1,3,5-tris(9,9-dibutylfluorenylbenzene). Examples 1 and 4 are comparative examples and, therefore, not within the scope of the blend of the present invention. These comparative examples are included to demonstrate that the viscosity modifier does not substantially alter the wavelength emission maximum of the blend as compared to that of the pure polymer. Furthermore, the data indicate that presence of the modifier enhances the efficiency of the device.

TABLE

| Example # | Polymer (wt/wt %) | Viscosity Modifier (wt/wt %) | Solution Viscosity (cPs) | EL Emission max (nm) | Device Efficiency @ 1000 Cd/m² |
|---|---|---|---|---|---|
| 1 (comp. ex.) | 1304 (2%) | none (0%) | 16.02 | 536 | 6.34 |
| 2 | 1304 (1.5%) | VM1 (0.5%) | 8.78 | 532 | 6.68 |
| 3 | 1304 (1%) | VM1 (1%) | 4.18 | 532 | 6.82 |
| 4 (comp. ex.) | 1100 (2%) | none (0%) | | 644 | 0.738 |
| 5 | 1100 (1%) | VM2 (1%) | | 640 | 0.790 |

What is claimed is:

1. A composition comprising a blend of
   a) a luminescent polymer having a weight average molecular weight ($M_w$) of at least 20,000 and
   b) a viscosity modifier that
      1) is a solid at room temperature;
      2) has a $M_w$ of less than 5000;
      3) has a luminescent emission maximum of 350 to 480 nm;
      4) does not substantially diminish charge transporting properties of the combination of the modifier and the polymer; and
      5) contains no exocyclic conjugated double bonds;
   wherein the modifier and its concentration in the blend are selected so that the blend exhibits a luminescent emission maximum that is within 20 nm of the luminescent emission maximum of the polymer alone, and the viscosity modifier contains no O, N, or S atoms with delocalized unshared pairs of electrons, and
   wherein the viscosity modifier is selected from the group consisting of 1,2,4-tris(9,9-dibutylfluorene)benzene and 1,3,5-tris(9,9-dibutylfluorenyl)benzene.

2. A composition comprising a blend of
   a) a luminescent polymer having a weight average molecular weight ($M_w$) of at least 20,000 and
   b) a viscosity modifier that
      1) is a solid at room temperature;
      2) has a $M_w$ of less than 5000;
      3) has a luminescent emission maximum of 350 to 480 nm;
      4) does not substantially diminish charge transporting properties of the combination of the modifier and the polymer; and
      5) contains no exocyclic conjugated double bonds;
   wherein the modifier and its concentration in the blend are selected so that the blend exhibits a luminescent emission maximum that is within 20 nm of the luminescent emission maximum of the polymer alone, and the viscosity modifier contains no O, N, or S atoms with delocalized unshared pairs of electrons, and
   wherein the polymer contains structural units of a first monomer selected from the group consisting of 9,9-dialkylfluorene, 9,9-diarylfluorene, and 9,9-aralkylfluorene, and a second monomer selected from the group consisting of substituted and unsubstituted thiophenes, dithiophenes, benzodiathiazoles, oxazoles, oxadiazoles, benzoxazoles, dibenzofurans, benzothiophenes, dibenzothiophenes, dibenzosiloles, benzidines, diarylamines, triarylamines, benzenes, biphenylenes, naphthalenes, anthracenes, phenanthrenes, styrenes, quinolines, and stilbenes.

3. A composition comprising a blend of
   a) a luminescent polymer having a weight average molecular weight ($M_w$) of at least 20,000 and the luminescent polymer includes structural units of a 9,9-disubstituted fluorene and a monomer selected from the group consisting of substituted and unsubstituted thiophenes, dithiophenes, benzodiathiazoles, oxazoles, oxadiazoles, benzoxazoles, dibenzofurans, benzothiophenes, dibenzothiophenes, dibenzosiloles, benzidines, diarylamines, triarylamines, benzenes, biphenylenes, naphthalenes, anthracenes, phenanthrenes, styrenes, quinolines, and stilbenes and
   b) a viscosity modifier that
      1) is a solid at room temperature;
      2) has a $M_w$ of less than 5000;
      3) has a luminescent emission maximum of from 350 to 480 nm;
      4) does not substantially diminish charge transporting properties of the combination of the modifier and the polymer; and
      5) contains no exocyclic conjugated double bonds; and
   c) a solvent for the luminescent polymer and the viscosity modifier;
   wherein the relative amounts of the modifier and the polymeric compound in the blend are such that the blend exhibits a luminescent emission maximum that is within 10 nm of the luminescent emission maximum of the polymer alone.

4. The composition of claim 3 wherein the luminescent polymer includes structural units of a 9,9-disubstituted fluorene and a monomer selected from the group consisting of benzidines, dithiophenes, benzothiadiazoles, and triarylamines.

5. The composition of claim 4 wherein the solvent is selected from the group consisting of toluene, cyclohexylbenzene, xylenes, mesitylene, tetralin, decalin, methyl benzoate, isopropyl biphenyl, and anisole.

6. The composition of claim 5 wherein the structural units of a 9,9-disubstituted fluorene include substituents at the 9,9-position are selected from the group consisting of $C_4$-$C_{12}$ alkyl, $C_4$-$C_{12}$-alkoxy, substituted phenyl, unsubstituted phenyl, substituted biphenyl, and unsubstituted biphenyl.

* * * * *